United States Patent
Chidambarrao et al.

(10) Patent No.: US 7,485,519 B2
(45) Date of Patent: Feb. 3, 2009

(54) AFTER GATE FABRICATION OF FIELD EFFECT TRANSISTOR HAVING TENSILE AND COMPRESSIVE REGIONS

(75) Inventors: Dureseti Chidambarrao, Weston, CT (US); William K. Henson, Beacon, NY (US); Yaocheng Liu, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/693,786

(22) Filed: Mar. 30, 2007

(65) Prior Publication Data

US 2008/0237709 A1 Oct. 2, 2008

(51) Int. Cl.
*H01L 21/8238* (2006.01)

(52) U.S. Cl. ............... 438/197; 438/154; 257/E21.632

(58) Field of Classification Search ............... 438/236, 438/157, 223, 153, 154, 197, 199; 257/E21.4, 257/E21.632
See application file for complete search history.

(56) References Cited

U.S. PATENT DOCUMENTS

| 7,135,724 B2 * | 11/2006 | Chen et al. ............... 257/288 |
| 7,198,995 B2 * | 4/2007 | Chidambarrao et al. ..... 438/157 |
| 7,247,534 B2 * | 7/2007 | Chidambarrao et al. ..... 438/223 |
| 2005/0064646 A1 * | 3/2005 | Chidambarrao et al. ..... 438/221 |
| 2006/0011984 A1 * | 1/2006 | Currie ........................ 257/352 |

* cited by examiner

*Primary Examiner*—Thanhha Pham
(74) *Attorney, Agent, or Firm*—Daryl Neff; H. Daniel Schnurmann

(57) ABSTRACT

A field effect transistor ("FET") is formed to include a stress in a channel region of an active semiconductor region of an SOI substrate. A gate is formed to overlie the active semiconductor region, after which a sacrificial stressed layer is formed which overlies the gate and the active semiconductor region. Then, the SOI substrate is heated to cause a flowable dielectric material in a buried dielectric layer of the SOI substrate to soften and reflow. As a result of the reflowing, the sacrificial stressed layer induces stress in a channel region of the active semiconductor region underlying the gate. A source region and a drain region are formed in the active semiconductor region, desirably after removing the sacrificial stressed layer.

12 Claims, 5 Drawing Sheets

AFTER GATE FABRICATION OF FIELD EFFECT TRANSISTOR HAVING TENSILE AND COMPRESSIVE REGIONS

BACKGROUND OF THE INVENTION

The present invention relates to semiconductor devices and their fabrication. More particularly, the invention relates to a method of fabricating a field effect transistor through use of a sacrificial stressed layer to apply a beneficial stress to the channel region of the FET.

Various methods exist for fabricating SOI substrates. In one example according to the prior art illustrated in FIG. 1, an SOI substrate 10 is fabricated to contain a region of strained silicon 12 having tensile stress in which a transistor, for example, an n-type field effect transistor ("NFET") will be formed. The tensile stressed silicon region 12 overlies a region 14 containing silicon germanium (SiGe) having relaxed stress, and the SiGe region, in turn, overlies a bulk silicon region 18, as separated therefrom by a buried oxide ("BOX") layer 16 containing borophosphosilicate glass ("BPSG").

To fabricate the prior art SOI substrate 10, a starting SOI substrate is provided which includes a compressive top SiGe layer 14 which overlies the bulk silicon layer 18, separated therefrom by a BOX layer including BPSG. Thereafter, a layer of silicon 12 is grown epitaxially from the surface of the SiGe layer. After patterning the silicon layer 12 and SiGe layer 14, e.g., by etching in accordance with a photolithographically defined mask layer (not shown), the temperature of the SOI substrate is elevated to a point at which the BPSG BOX layer 16 softens and begins to "flow". As a result, the stress in the SiGe layer 14 relaxes, and in consequence, a tensile stress develops in the silicon layer 12 above the SiGe layer 14.

One of the drawbacks of the prior art SOI substrate 10 is that after the active silicon region 12 is defined, the SiGe stressor layer 14 continues to underlie the active silicon region 12 in which the transistor is to be formed. This fact hinders some of the flexibility of the design of the transistor to be formed thereon, as the underlying SiGe layer 14 can contribute to junction capacitance, reducing the performance benefit to be gained from the SOI structure. In addition, the permanent presence of the SiGe layer 14 can lead to undesirable diffusion of germanium and arsenic into portions of the transistor to be formed in the active silicon region 12. Another drawback is that threading defects can occur which can lead to shorts of the gate dielectric.

SUMMARY OF THE INVENTION

In accordance with an aspect of the invention, a field effect transistor ("FET") is formed to include a stress in a channel region of an active semiconductor region of an SOI substrate. A gate is formed to overlie the active semiconductor region. A sacrificial stressed layer can then be formed which overlies the gate and the active semiconductor region. The SOI substrate can then be heated to cause a flowable dielectric material in a buried dielectric layer of the SOI substrate to soften and reflow. Desirably as a result of the reflowing, the sacrificial stressed layer induces stress in a channel region of the active semiconductor region underlying the gate. Desirably, a source region and a drain region are formed in the active semiconductor region after removing the sacrificial stressed layer.

DETAILED DESCRIPTION

Figure 1:
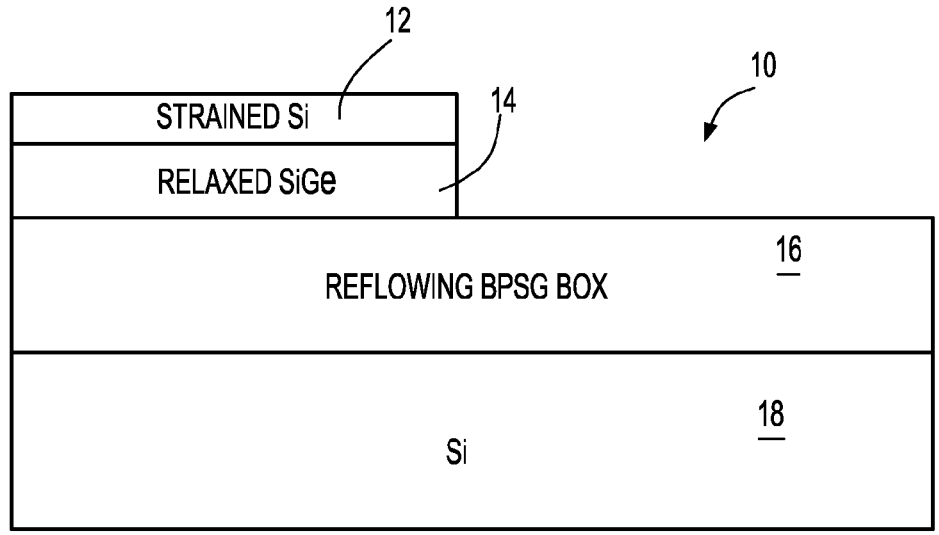
FIG. 1 is a sectional view illustrating a structure and method of fabricating a SOI substrate in accordance with the prior art.
Figure 2:
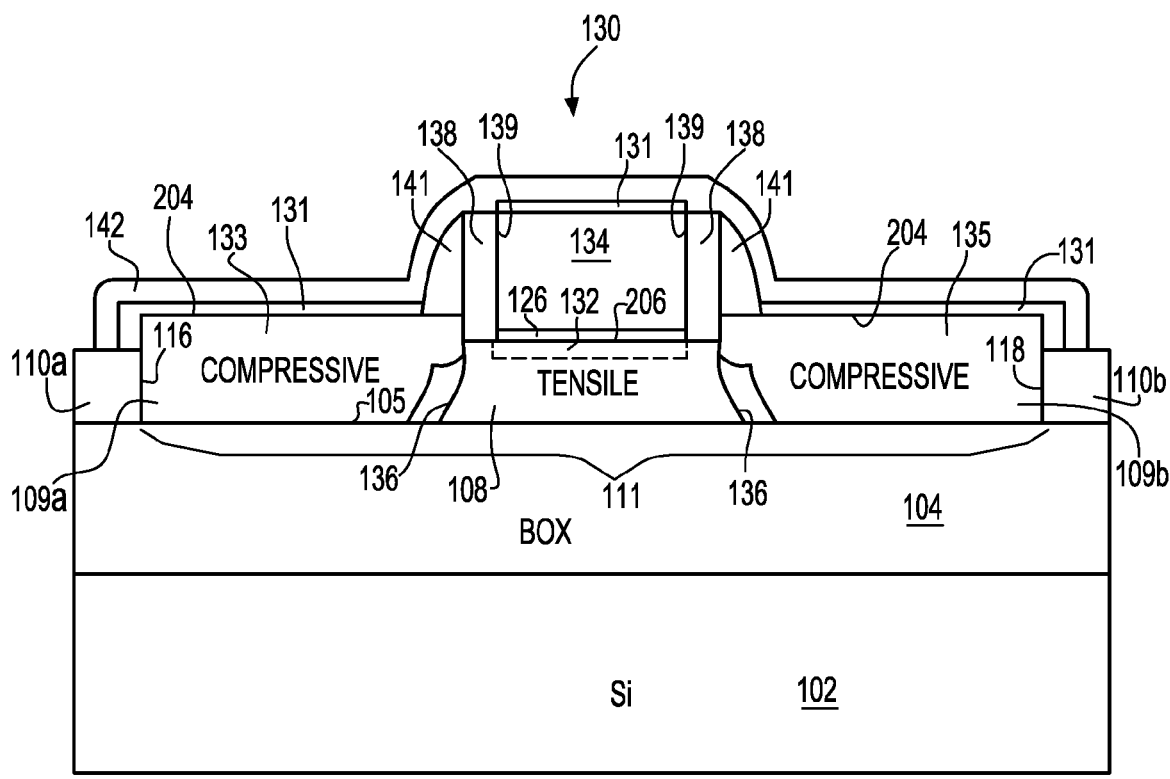
FIG. 2 is a sectional view illustrating an n-type conduction channel field effect transistor ("NFET") in accordance with one embodiment of the invention.

An n-type conduction channel field effect transistor ("NFET") 130 according to a first embodiment of the invention is illustrated in FIG. 2. The NFET has an n-type conduction channel 132 in a tensile-stressed region 108 of an active semiconductor region 111. The active semiconductor region 111 is disposed in a silicon-on-insulator ("SOI") layer or semiconductor-on-insulator layer overlying a bulk semiconductor region 102, the SOI layer being separated from the bulk semiconductor region 102 by a buried dielectric layer 104 such as a buried oxide ("BOX") layer. The buried dielectric layer includes a flowable dielectric material, for example, a doped silicate glass or other flowable dielectric material. Doped silicate glasses typically are doped with one or both of boron or phosphorus. Borosilicate glass ("BSG") refers to such glass doped with boron, phosphosilicate glass ("PSG") refers to such glass doped with phosphorus and borophosphosilicate glass ("BPSG") refers to such glass doped with both boron and phosphorus. The bulk semiconductor region 102 consists essentially of monocrystalline silicon, for example. In a particular embodiment, the BOX layer includes a layer consisting essentially of BSG as the flowable dielectric material.

A trench isolation region 110a is disposed adjacent to a peripheral edge 116 of the active semiconductor region 111. Another trench isolation region 110b is disposed adjacent to another peripheral edge 118 of the active semiconductor region 111. The two trench isolation regions 110a, 110b serve to inhibit the magnitude of the tensile stress from relaxing in the tensile stressed region 108, such that a desirably high magnitude tensile stress is maintained therein.

A source region 133 and a drain region 135 are disposed within the two compressive stressed silicon regions 109a, 109b, respectively. A low-resistance layer 131 which may include a metal, a silicide of a metal or other conductive compound of a metal desirably overlies the source and drain regions 133, 135. Each of the compressive stressed silicon regions 109a, 109b shares an edge 136 with the tensile stressed silicon region 108. The NFET 130 has a gate which may include a gate conductor layer 134 such as semiconductor layer having a polycrystalline or amorphous state contacting a gate dielectric layer 126. Typically, the gate conductor 134 consists essentially of polysilicon. The low-resistance layer 131 also overlies the gate conductor layer 134. In a particular embodiment, instead of a polycrystalline semiconductor, the gate conductor layer 134 may include a metal or silicide in contact with the gate dielectric layer 126. The gate conductor layer 134 of the NFET 130 is registered with the tensile stressed region 108 in the active semiconductor region. First dielectric spacers 138 have edges 139 in contact with the gate conductor layer 134. Second dielectric spacers 141 overlie exposed edges of the first dielectric spacers 138. The edges of the first dielectric layer may or may not be aligned with the edges 136 of the compressive stressed region.

The source and drain regions 133, 135 may be "raised" such that a distance between a top major surface 204 of the source and drain regions 133, 135 and a top major surface 105 of the BOX layer is greater than a distance between a top major surface 206 of the tensile-stressed semiconductor region 108 and the top major surface 105 of the BOX layer. In one example, when the distance between the top surface 206 of region 108 and the top surface 105 of the BOX layer is about 50 nanometers, desirably, the source and drain regions are raised such that the distance between the top surface 204 of the source and drain regions and the top surface of the BOX layer is at least about 70 nanometers, or at least 20 nanometers greater. In a particular embodiment, the distance between the top surface 204 of the source and drain regions and the top surface of the BOX layer is not more than 50 nanometers greater than the distance between the top surface 206 of region 108 and the top surface of the BOX layer.

A tensile stressed dielectric liner 142 can be provided overlying the NFET 130 to further enhance the magnitude of the tensile stress applied to the channel region of the NFET. The tensile-stressed liner can include or consist essentially of silicon nitride, for example.

In most silicon-on-insulator and bulk silicon substrates, the direction of current flow in the channel of an FET transistor is in the <110> crystal orientation. In such substrates, the performance of a field effect transistor ("FET") benefits when a beneficial stress is applied to the channel region of the FET in the direction of current flow in the channel between the source and drain. The performance of an n-type FET or "NFET" benefits the most when tensile stress is applied to the channel region in the direction of the current flow between the source and drain. The performance of a p-type FET or "PFET" benefits the most when compressive stress is applied to the channel region in the direction of the current flow between the source and drain.

Owing to the way in which the stressed active semiconductor region in the SOI substrate is formed, the channel region of the NFET desirably has a large tensile stress near an exposed major surface 206 (typically a top surface) of the SOI layer, i.e., the surface of the channel region 108 in contact with the gate dielectric layer 126. The magnitude of the stress desirably peaks near that exposed major surface of the SOI layer. Moreover, the magnitude of the stress typically falls within the channel region in a direction (typically downwardly direction) from the major surface of the SOI layer towards a bottom surface of the SOI layer adjacent to the BOX layer. The stress magnitude may be much lower. For example, the magnitude of the stress may be three to 300 times less at a bottom major surface of the SOI layer in contact with the top surface 105 of the BOX layer than the magnitude of the stress at the major surface. The stress at the bottom surface may even be of the opposite polarity than the stress at the exposed major surface. For example, the stress may be compressive near the exposed major surface and tensile near the bottom surface, or the stress may be tensile near the exposed major surface and compressive near the bottom surface. In addition, the magnitude of the stress within the channel region desirably is uniform in a longitudinal direction of the FET, i.e., in a direction of current flow between the source region and the drain region across the channel region of the FET. Desirably, the magnitude of the stress is also mostly uniform in the transverse direction (direction of the width of the channel region), the stress magnitude typically falling at opposite transverse edges of the channel region.

Figure 3:
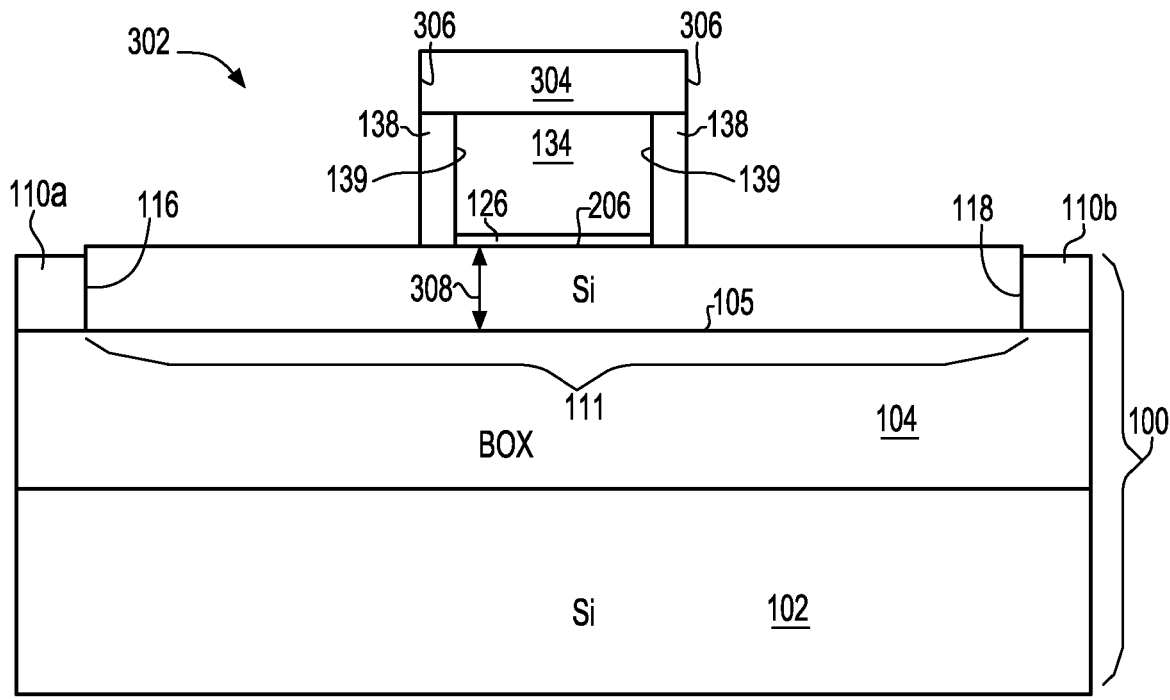
FIGS. 3 through 8 are sectional views illustrating a method of fabricating an NFET in accordance with an embodiment of the invention.

Referring to FIG. 3, a method will now be described of fabricating an NFET in accordance with an embodiment of the invention. FIG. 3 illustrates a preliminary stage of fabrication in which a gate 302 including a gate conductor layer 134 overlies a gate dielectric layer 126 disposed on an active semiconductor region 111 of an SOI layer of a substrate 100. At this stage of fabrication, the gate need not be fully fabricated and need not contain a final dopant concentration. For example, steps later in the fabrication process may be needed to impart a final dopant concentration to the gate or redistribute a dopant in the gate in order to complete the fabrication of the gate. At this stage of fabrication, the gate may even be a dummy gate which will be removed and replaced by subsequent processing to form a final gate. As the context requires, the term "gate" herein refers to such the final gate, an incompletely fabricated gate or a dummy gate.

Desirably, the active semiconductor region 111 is a thin SOI layer at this stage of fabrication, having a thickness 308 of less than 100 nm, as measured between the top major surface 206 of the SOI layer in contact with the gate dielectric and the bottom major surface 105 in contact with the BOX layer 104. The active semiconductor region desirably has a thickness 308 of about 50 nm or less.

The gate conductor layer 134 at this stage of fabrication typically includes a polycrystalline semiconductor such as polysilicon. The active semiconductor region 111 is bounded at peripheral edges 116, 118 by trench isolation regions 110a, 110b. First dielectric spacers 138 have edges 139 in contact with the gate conductor layer 134. The dielectric spacers 138 can be formed by local oxidation of semiconductor material present at edges of the gate conductor layer. Alternatively, the dielectric spacers 138 can be formed by deposition of a dielectric layer and subsequently etching that layer anisotropically in a downward direction aligned with the direction of the edges 139. For example, a reactive ion etch ("RIE") process can be used to perform the anisotropic etching process. A cap layer 304 overlies the gate conductor layer 134, the cap layer typically being formed by depositing a layer of dielectric material to overlie the gate conductor layer 134 and then etching the cap layer by the same anisotropic etch process to define edges 306 of the cap layer at the same time that edges of the gate conductor layer 134 are defined. In one example, the dielectric spacers consist essentially of silicon oxide and the cap layer consists essentially of silicon nitride.

Figure 4:
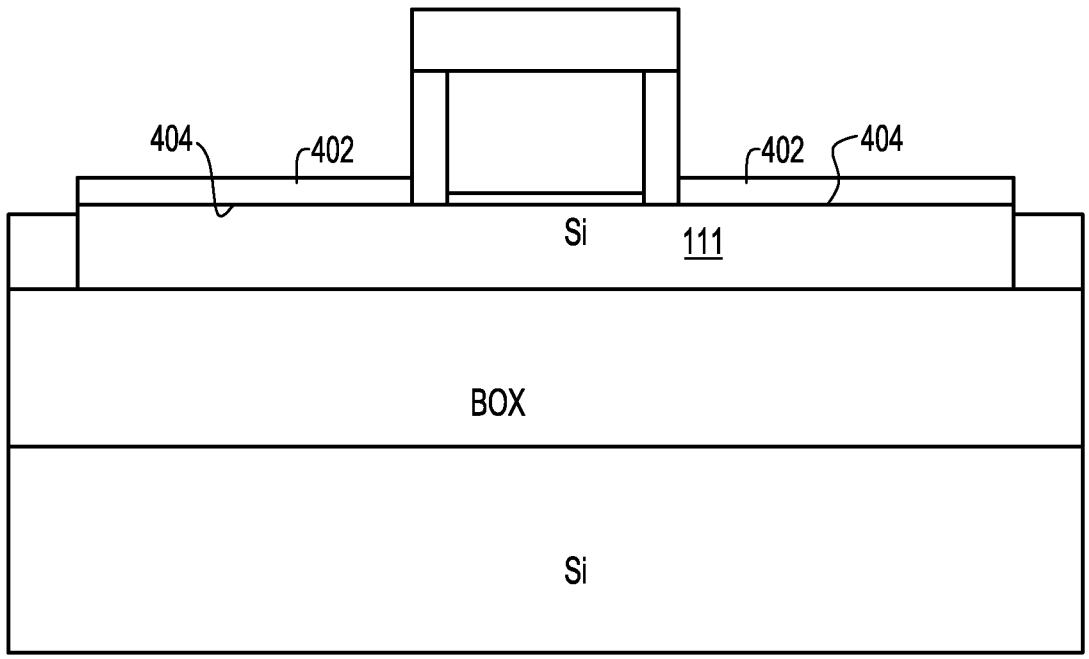

In the stage of fabrication illustrated in FIG. 4, a monocrystalline semiconductor layer 402 is epitaxially grown from an exposed major surface 404 of the active semiconductor region 111. As the epitaxial layer 402 grows, the layer 402 rises above the major surface 404 of the active semiconductor region 111. Typically, the epitaxial semiconductor layer 402 consists essentially of silicon.

Figure 5:
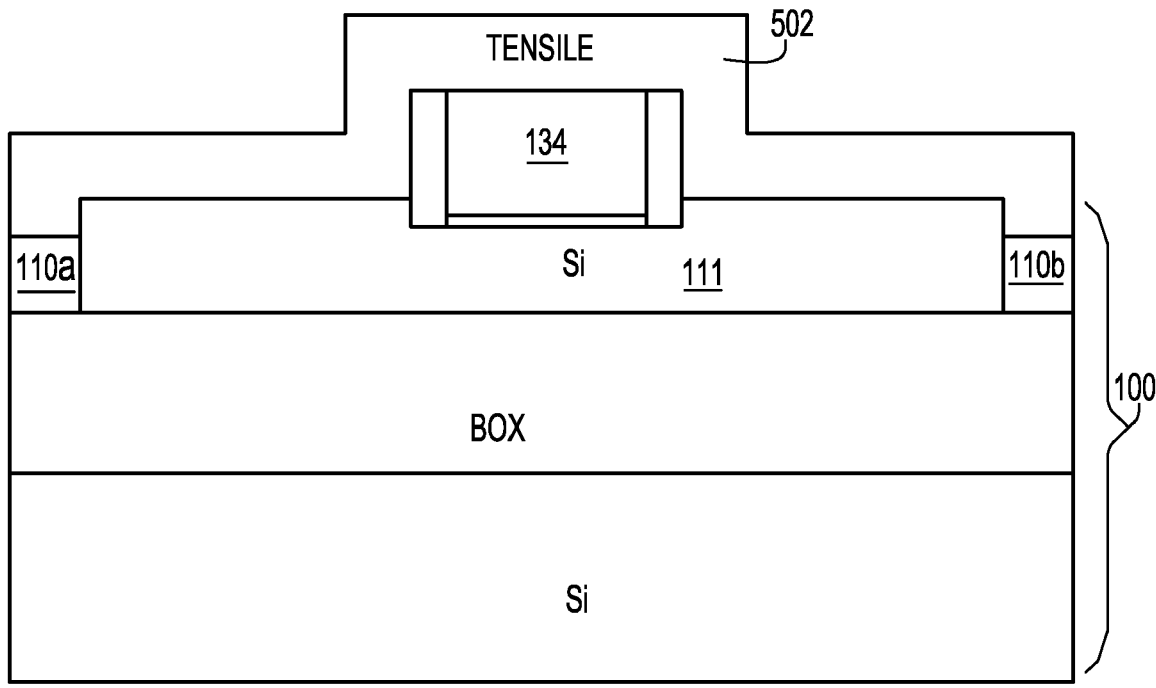

Thereafter, in a subsequent stage of fabrication illustrated in FIG. 5, the cap layer is removed from overlying the gate conductor layer 134 and a sacrificial tensile stressed layer is deposited to overlie the gate conductor layer and exposed portions of the substrate including the active semiconductor region 111. The sacrificial stressed layer may also overlie the trench isolation regions 110a, 110b. The tensile stressed layer 502 may include a stressed dielectric material such as a stressed layer of silicon nitride.

Figure 6:
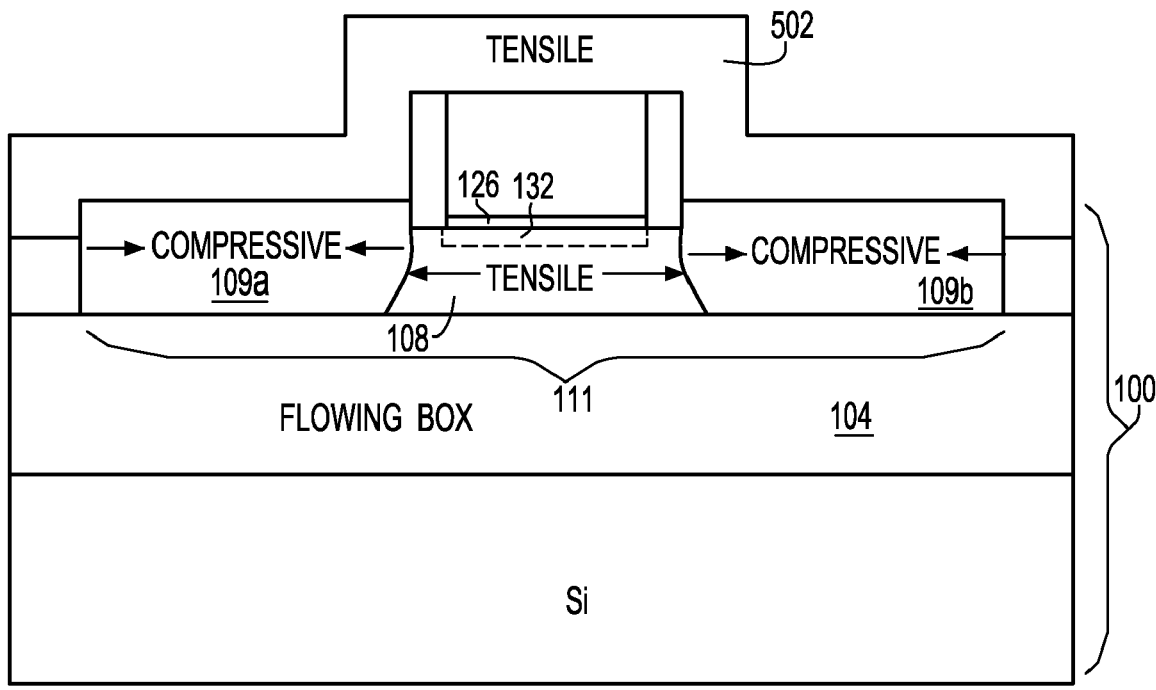

Thereafter, in a subsequent stage of fabrication illustrated in FIG. 6, the substrate 100 is heated while the sacrificial stressed layer 502 remains in place. The temperature of the substrate is elevated to a point at which the flowable dielectric material within the BOX layer 104 softens and begins to "flow". Such temperature needs to be below a temperature which would directly cause the material properties of the sacrificial stressed layer 502 to change. When the sacrificial stressed layer 502 consists essentially of tensile stressed silicon nitride, the substrate 100 and the stressed layer 502 thereon can be elevated to a temperature of up to about 1000 degrees C. without causing the material properties of the tensile stressed silicon nitride layer 502 to worsen significantly.

As the flowable dielectric material of the BOX layer softens, it becomes pliable. The pliability of the material permits the stresses in the overlying sacrificial stressed layer 502 and the active semiconductor region 111 to move closer to equilibrium. As a result, the tensile stress within the tensile stressed layer 502 tends to relax, causing portions 109a, 109b of the underlying active semiconductor region 111 in contact with the tensile stressed layer 502 to acquire compressive stress. However, a different result obtains in area 108 of the active semiconductor region 111 which does not directly underlie the tensile stressed sacrificial layer 502. Here, area 108 becomes tensile stressed when the BOX layer 104 softens due to heating the substrate. Area 108 becomes tensile stressed as a result of its relationship and proximity to the tensile stressed sacrificial layer 502. A tensile stress of 0.5 GPa to about 1.5 GPa or greater may be achieved in the active conduction channel 132 of the FET near the major surface of the channel region 108 in contact with the gate dielectric 126 of the FET.

Figure 7:
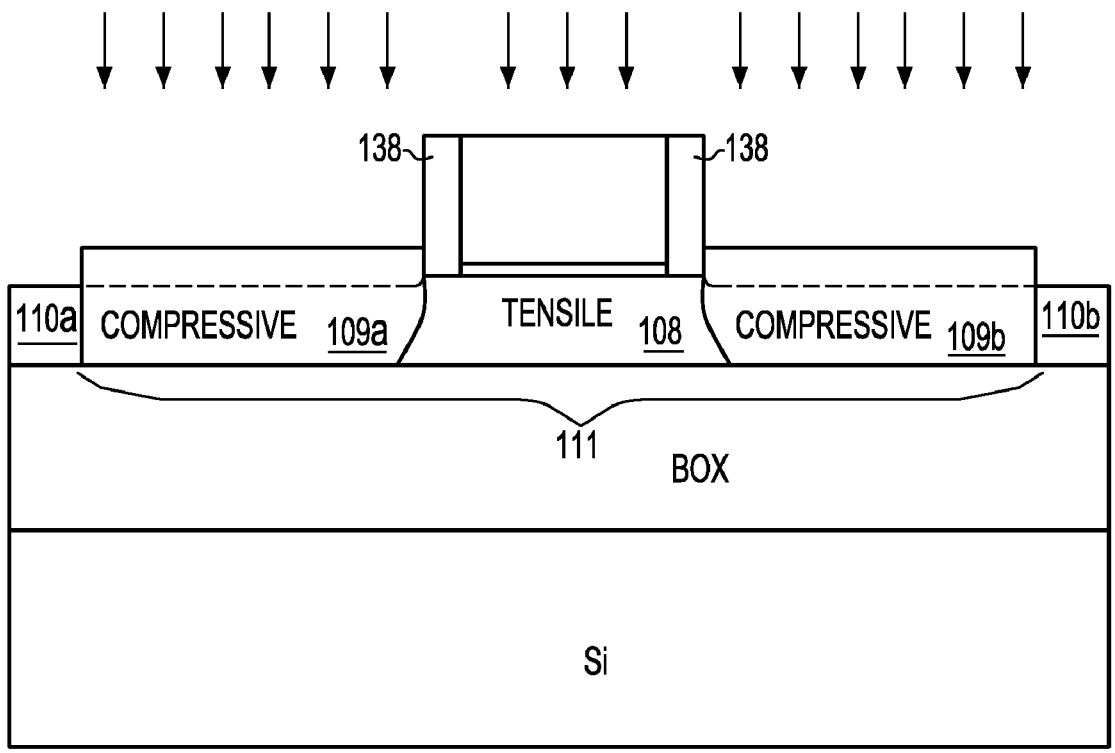

The sacrificial stressed layer 502 then is removed from over the active semiconductor region 111, resulting in the structure shown in FIG. 7. The sacrificial stressed layer can be removed, for example, by performing etching or cleaning processes or both in a manner selectively to the underlying silicon material in the stressed semiconductor region 111. Once the sacrificial stressed layer has been removed, subsequent processing does not cause the stress level in the active semiconductor region to decrease much. Desirably, the thermal budget of subsequent processing used to complete the fabrication of a chip including FETs, interconnects thereto, etc., is designed, i.e., constrained such that the BOX layer does not relax again after the sacrificial stressed layer is removed. In cases where the thermal budget of subsequent processing may be high enough to cause the BOX layer to relax, the STI regions 110a, 110b exert stabilizing forces which limit expansion or contraction of the active semiconductor region 111. In such way, the STI regions help prevent the magnitude of the tensile stress in the channel region 108 from decreasing due to relaxation during subsequent processing.

Figure 8:
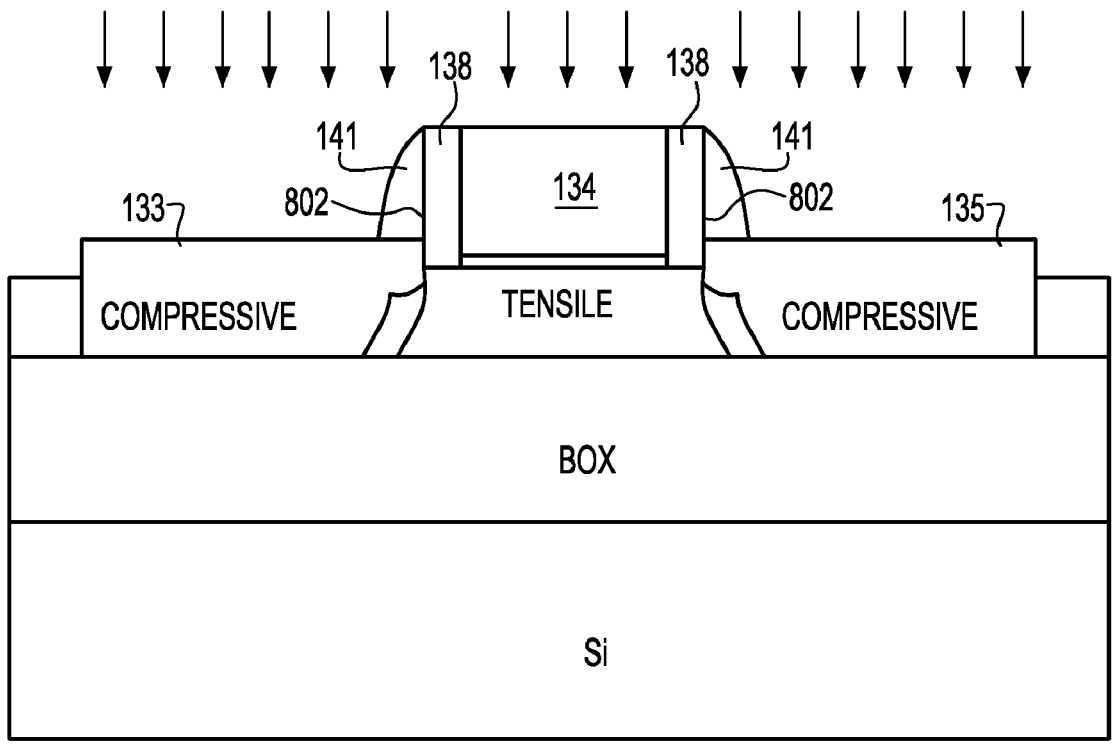

Thereafter, an ion implantation process is performed. Initially, with only the first dielectric spacers 138 in place, extension regions or halo regions are formed in the compressive stressed regions 109b and 109b. Subsequently, the second dielectric spacers 141 (FIG. 8) are formed to overlie exposed walls 802 of the first dielectric spacers 138, after which another ion implantation process is performed to implant an n-type dopant, e.g., phosphorus, into the compressive stressed regions 109a, 109b to form a source region 133 and a drain region 135, respectively. This implantation process desirably also simultaneously sets the dopant concentration in the gate conductor layer 134. Subsequent annealing of the substrate desirably is performed to distribute the implanted dopant within the source and drain regions and the gate conductor layer.

Referring to FIG. 2 again, thereafter, the low-resistance layer 131 is formed to overlie the source and drain regions 133, 135 and the gate conductor layer 134 between them. The low-resistance layer 131 can include, for example, a silicide formed in alignment with exposed silicon material of the gate conductor layer 134 and the source and drain regions 133, 135. Such silicide can be formed by depositing a silicide-forming metal such as tungsten, cobalt or nickel, among other possible metals, and then heating the substrate to cause the metal to react with the exposed silicon to form the silicide. Subsequently, unreacted metal overlying surfaces of the dielectric spacers and trench isolation regions is selectively removed. After forming the low-resistance layer 131, to further enhance the magnitude of the tensile stress within the channel region 108, a permanent tensile-stressed dielectric liner 142 can be formed to overlie the active semiconductor region 111.

In a variation of the above-described embodiment, the epitaxial layer 402 (FIG. 4) includes a stressed semiconductor layer. For example, layer 402 can include an epitaxial layer of silicon carbon which has an internal tensile stress. The tensile stressed silicon carbon layer assists in applying or maintaining tensile stress in the channel region 132 (FIG. 2) of the transistor. In such case, the BOX layer desirably consists essentially of phosphosilicate glass ("PSG") rather than BPSG. PSG has a higher reflow temperature which is desirable to permit the layer of silicon carbon to be grown without causing the PSG layer to reflow at that temperature. Later in the fabrication process (FIG. 6), the PSG layer is reflowed at a temperature such as, for example, a temperature ranging between about 750 and about 900 degrees C.

In accordance with another variation of the method described above, after forming the low-resistance layer 131, steps can be performed to remove the original gate and form a replacement gate. For example, the gate conductor layer 134 and low-resistance layer in contact therewith (if present) can be removed and another gate formed in its place. To do so, a relatively thick dielectric layer (not shown), which can be referred to as an "M0" dielectric layer, can be deposited to overlie the FET 130, after which an opening is made which extends downwardly from a top surface of that dielectric layer to expose the low-resistance layer 131 or the gate conductor layer 134 between edges 139 of the first dielectric spacers 138. The gate conductor layer or low-resistance layer are then removed selectively to the dielectric materials of the M0 dielectric layer, the dielectric spacers and the gate dielectric layer. An ion implantation process can be performed through the gate dielectric layer 126, if desired, to set a dopant level within the tensile-stressed region 108 underlying the gate dielectric layer. Subsequently, a new gate is formed between the edges 139 of the first dielectric spacers 138, such as by deposition of a metal, conductive compound of a metal, a semiconductor, through use of a silicide-forming process such as can be used to form the low-resistance layer 131 as described above, or through a combination of such.

Figure 9:
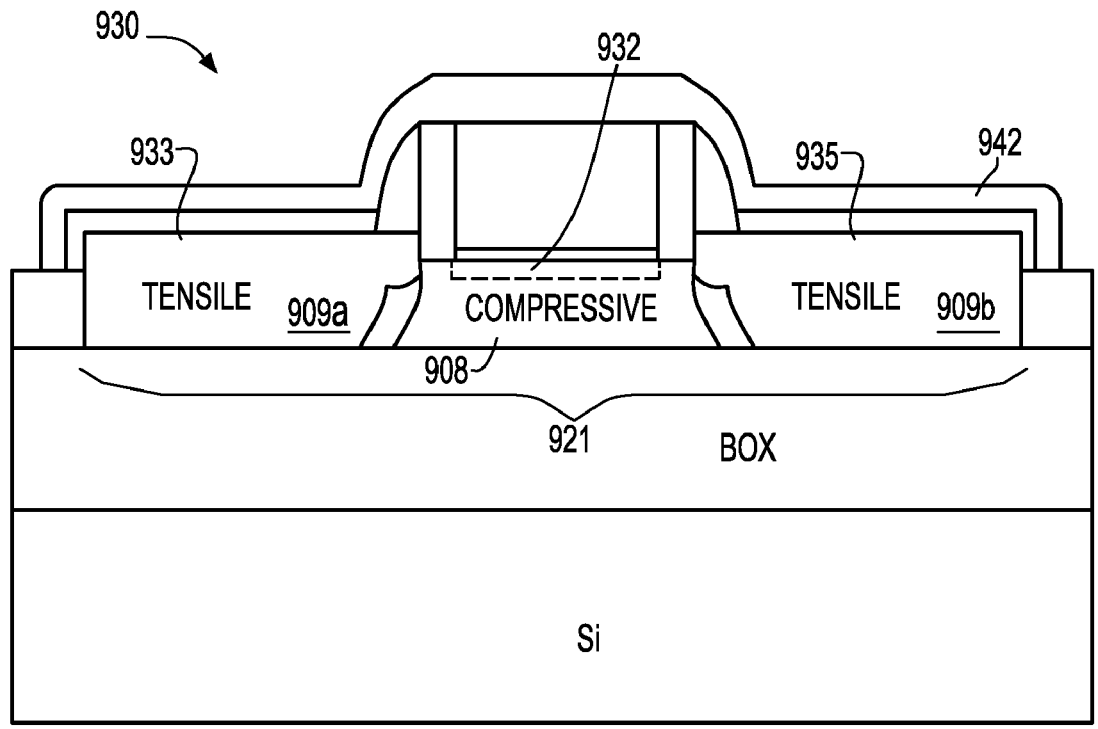
FIG. 9 is a sectional view illustrating an n-type conduction channel field effect transistor ("NFET") in accordance with one embodiment of the invention.

FIG. 9 illustrates a p-type conductivity field effect transistor ("PFET") 930 in accordance with a variation of the embodiment described above with reference to FIGS. 2 through 8. In this embodiment, the source and drain regions 933, 935 are provided in tensile stressed semiconductor regions 909a, 909b, respectively, and the p-type conduction channel 932 is provided in a compressive-stressed semiconductor region 908. A permanent compressive-stressed dielectric liner 942 can be provided overlying an active semiconductor region 921, the active semiconductor region including the compressive-stressed region 908 and tensile-stressed regions 909a and 909b.

The PFET 930 is fabricated by steps similar to those described above for fabricating the NFET 130, except that a compressive-stressed sacrificial layer is deposited to overlie the active semiconductor region 921 instead of the tensile-stressed layer 502 (FIG. 5). The sacrificial stressed layer can include or consist essentially of compressive-stressed silicon nitride, for example. When the substrate is heated to a temperature sufficient to cause the BOX layer to soften or flow, the compressive-stressed sacrificial layer causes the portion 908 of the active semiconductor region underlying the gate conductor layer to become compressive-stressed. Portions 909a, 909b of the active semiconductor region become tensile-stressed during this process.

In a variation of the above-described embodiment, a semiconductor alloy having an internal compressive stress can be embedded in regions of the transistor adjacent to the channel region. Embedded regions of silicon germanium can be provided in the source and drain regions adjacent to the channel region for applying compressive stress to the channel region of the PFET. For example, the epitaxial layer 402 (FIG. 4) can be formed to include a layer of silicon germanium which has an internal compressive stress.

Both PFETs and NFETs can be provided on the same substrate, each transistor being as described above with reference to FIGS. 2 and 9. However, each type of transistor need not have a channel region with the most beneficial type of stress for the transistor. Thus, a substrate can be fabricated to contain transistors with channel regions having tensile stress but without transistors which have channel regions that have compressive stress. In such case, NFETs can be provided which have channel regions disposed in the tensile stressed regions. PFETs can also be provided which have channel regions disposed in the tensile stressed regions. However, it is recognized that PFETs fabricated in this way may incur a degradation of performance. Alternatively, PFETs can be provided which have channel regions disposed in the compressive stressed regions. NFETs may also be provided which have channel regions in the compressive stressed regions of the substrate. In such case, NFETs fabricated in this way may incur a degradation of performance. Such substrate may also include active semiconductor regions which have neutral stress, in which case, NFETs may be provided in neutral stress regions without incurring performance degradation to the same degree.

Figure 10:
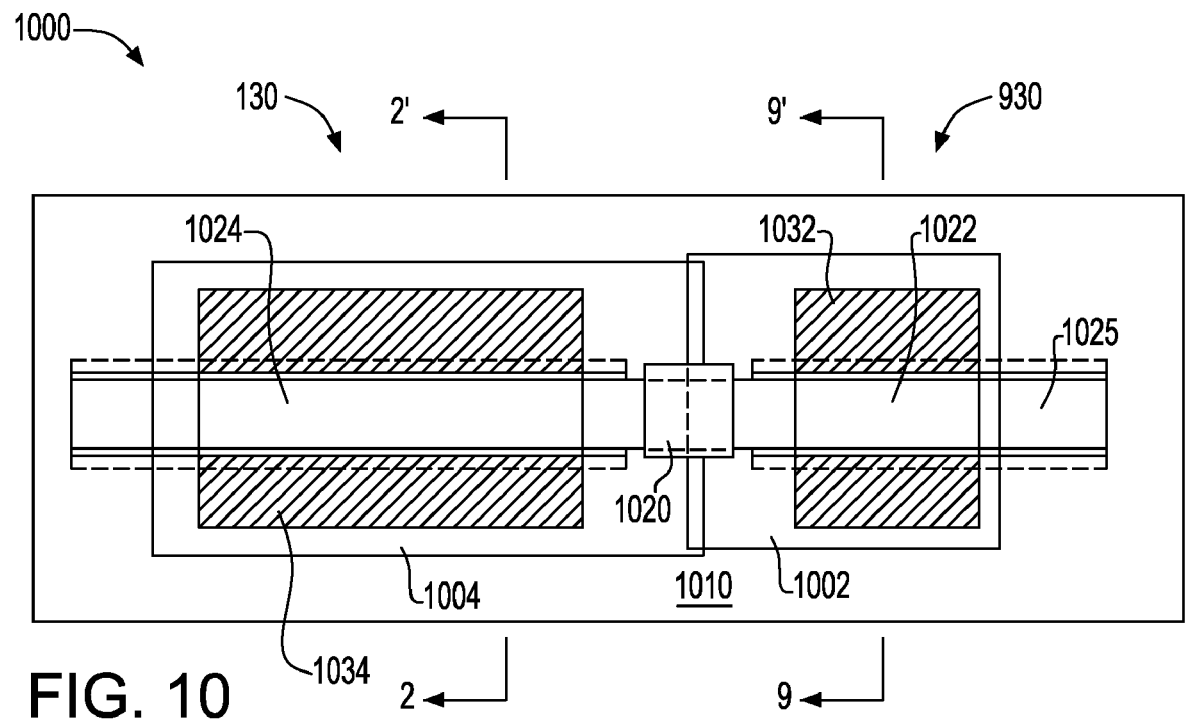
FIG. 10 is a plan view illustrating a microelectronic structure including an NFET and a PFET according to an embodiment of the invention.

In the microelectronic structure 1000 illustrated in plan view in FIG. 10, an NFET 130 includes a first active semiconductor region 1034 and a PFET 930 includes a second active semiconductor region 1032. Such structure can be advantageously employed in complementary metal oxide semiconductor logic circuits, e.g., inverters and static random access memory ("SRAM") circuits. The microelectronic structure shown in FIG. 10 includes the NFET 130 and the PFET 930 described above with reference to FIGS. 2 and 9 where FIG. 2 is a sectional view of the NFET through line 2-2' of FIG. 10 and FIG. 9 is a sectional view of the PFET through line 9-9' of FIG. 10.

As illustrated in FIG. 10, the first and second active semiconductor regions are separated by a trench isolation region 1010. The NFET has a first gate conductor 1024 and the PFET has a second gate conductor 1022, the first and second gate conductors being portions of a single continuous gate structure 1025. A conductive via 1020 contacts the gate conductor structure 1025 at a location between the first and second active semiconductor regions 1032, 1034 for controlling the potential applied to the first and second gate conductors. As further shown in FIG. 10, a permanent tensile-stressed dielectric liner 1004, e.g., a stressed nitride liner, overlies the first active semiconductor region. A permanent compressive-stressed dielectric liner 1002, e.g., a stressed nitride liner, overlies the second active semiconductor region.

In fabricating the microelectronic structure shown in FIG. 10, a trench isolation region 1010 is formed which extends downwardly from a major surface of the SOI layer, the trench isolation region defining peripheral edges of a first active semiconductor region and a second active semiconductor region. The first and second gate conductors are then formed. Each of the first and second gate conductors may be portions of one single continuous gate conductor structure overlying the first and second active semiconductor regions and the trench isolation region between the first and second active semiconductor regions. Typically, at least the first dielectric spacers are formed to overlie walls of the first and second gate conductors at this stage of fabrication.

A tensile stressed sacrificial layer is then formed to overlie the first active semiconductor region and a compressive stressed sacrificial layer is formed to overlie the second active semiconductor region. For example, one of the tensile and compressive stressed sacrificial layers is deposited and patterned, after which the other one of the tensile and compressive stressed sacrificial layers is deposited and patterned. Desirably, the tensile and compressive stressed sacrificial layers also overlie the gate conductor structure 1025. The tensile and compressive stressed sacrificial layers may or may not overlap after this stage of fabrication is completed.

Then, the SOI substrate is heated sufficiently to cause the flowable dielectric material in the buried dielectric layer to soften. As a result, the tensile-stressed sacrificial layer induces a tensile stress in a portion of the first active semiconductor region underlying the first gate conductor. Similarly, the compressive-stressed sacrificial layer induces a compressive stress in a portion of the second active semiconductor region underlying the second gate conductor. Then, the tensile-stressed and compressive stressed sacrificial layers are removed. An n-doped NFET source region and an n-doped NFET drain region are formed adjacent to a first gate conductor overlying the first active semiconductor region. A p-doped PFET source region and a p-doped PFET drain region are formed adjacent to a second gate conductor overlying the second active semiconductor region.

While the invention has been described in accordance with certain preferred embodiments thereof, many modifications and enhancements can be made thereto without departing from the true scope and spirit of the invention, which is limited only by the claims appended below.

What is claimed is:

1. A method of fabricating a field effect transistor ("FET") having a channel region in a silicon-on-insulator ("SOI") layer of an SOI substrate, the SOI substrate including (i) the SOI layer separated from (ii) a bulk semiconductor layer by (iii) a buried dielectric layer including a flowable dielectric material, the method comprising:

a) forming trench isolation regions adjacent to peripheral edges of an active semiconductor region of the SOI layer, the trench isolation regions extending from a major surface of the SOI layer towards the buried dielectric layer;

b) forming a gate overlying the active semiconductor region between the peripheral edges;

c) forming a sacrificial stressed layer overlying the gate and the active semiconductor region;

d) heating the SOI substrate to cause the flowable dielectric material to soften, causing the sacrificial stressed layer to induce a stress in a portion of the active semiconductor region underlying the gate;

e) removing the sacrificial stressed layer; and f) forming a source region and a drain region after removing the sacrificial stressed layer.

2. The method of forming a FET as claimed in claim 1, further comprising forming an epitaxial semiconductor layer adjacent to the gate prior to step (c), wherein the source region and drain region include portions of the epitaxial semiconductor layer.

3. The method of forming a FET as claimed in claim 1, wherein the sacrificial stressed layer includes stressed silicon nitride.

4. The method of forming a FET as claimed in claim 3, wherein the flowable dielectric layer includes silicate glass doped with at least one of boron or phosphorus.

5. The method of forming a FET as claimed in claim 4, wherein the doped glass layer is doped with phosphorus.

6. The method of forming a FET as claimed in claim 1, further comprising depositing a stressed liner to overlie the active semiconductor region after step (f), the stressed liner increasing the stress in the channel region of the FET.

7. The method of forming a FET as claimed in claim 1, wherein the sacrificial stressed layer has an internal tensile stress and the stress induced in the portion of the active semiconductor region underlying the gate is tensile.

8. The method of forming a FET as claimed in claim 7, wherein the step (d) induces compressive stress in portions of the active semiconductor region adjacent to the gate.

9. The method of forming a FET as claimed in claim 1, wherein the sacrificial stressed layer has an internal compressive stress and the stress induced in the portion of the active semiconductor region underlying the gate is compressive.

10. The method of forming a FET as claimed in claim 9, wherein the step (d) induces tensile stress in portions of the active semiconductor region adjacent to the gate.

11. A method of fabricating an n-type conduction channel field effect transistor ("NFET") and a p-type conduction channel field effect transistor ("PFET"), each of the NFET and the PFET having a channel region in a silicon-on-insulator ("SOI") layer of an SOI substrate, the SOI substrate including (i) the SOI layer separated from (ii) a bulk semiconductor layer by (iii) a buried dielectric layer including a flowable dielectric material, the method comprising:

a) forming trench isolation regions adjacent to peripheral edges of a first active semiconductor region of the SOI layer and a second active semiconductor region of the SOI layer, the trench isolation regions extending from a major surface of the SOI layer towards the buried dielectric layer;

b) forming a first gate overlying the first active semiconductor region and a second gate overlying the second active semiconductor region;

c) forming a tensile stressed sacrificial layer overlying the first active semiconductor region and a compressive stressed sacrificial layer overlying the second active semiconductor region;

d) heating the SOI substrate to cause the flowable dielectric material to soften, causing the tensile stressed sacrificial layer to induce a tensile stress in a portion of the first active semiconductor region underlying the first gate and causing the compressive stressed sacrificial layer to induce a compressive stress in a portion of the second active semiconductor region underlying the second gate;

e) removing the tensile stressed sacrificial layer and the compressive stressed sacrificial layer;

f) forming an n-doped NFET source region and an n-doped NFET drain region after step (e); and g) forming a p-doped PFET source region and a p-doped PFET drain region after step (e).

12. A method of forming an NFET and a PFET as claimed in claim 11, further comprising forming a tensile-stressed dielectric liner overlying the first active semiconductor region after step (f) and forming a compressive-stressed dielectric liner overlying the second active semiconductor region after step (g).

\* \* \* \* \*